United States Patent [19]
Aoki et al.

[11] Patent Number: 5,925,574
[45] Date of Patent: Jul. 20, 1999

[54] METHOD OF PRODUCING A BIPOLAR TRANSISTOR

[75] Inventors: Kenji Aoki; Tadao Akamine; Yoshikazu Kojima, all of Tokyo, Japan

[73] Assignee: Seiko Instruments Inc., Tokyo, Japan

[21] Appl. No.: 07/865,646

[22] Filed: Apr. 10, 1992

Related U.S. Application Data

[63] Continuation of application No. 07/620,624, Dec. 3, 1990, abandoned.

[30]   Foreign Application Priority Data

Dec. 1, 1989  [JP]  Japan ................................. 1-313724
  Dec. 1, 1989  [JP]  Japan ................................. 1-313725

[51] Int. Cl.$^6$ ............................................. H01L 21/265
[52] U.S. Cl. ........................ 437/31; 437/141; 437/160; 437/168; 148/DIG. 17; 148/DIG. 34; 148/DIG. 144
[58] Field of Search ............................ 437/31, 32, 141, 437/160, 168; 148/DIG. 17, DIG. 158, DIG. 144, DIG. 34

[56]            References Cited

U.S. PATENT DOCUMENTS

| | | | |
|---|---|---|---|
| 3,506,508 | 4/1970 | Nickl . | |
| 4,242,691 | 12/1980 | Kotani et al. | 357/23 |
| 4,395,433 | 7/1983 | Nagakubo et al. | 427/35 |
| 4,441,932 | 4/1984 | Akasaka et al. | 148/1.5 |
| 4,737,471 | 4/1988 | Shirato et al. | 437/44 |
| 4,791,074 | 12/1988 | Tsunashima et al. | 148/DIG. 158 |
| 4,855,258 | 8/1989 | Allman et al. . | |
| 4,861,729 | 8/1989 | Fuse et al. | 437/18 |
| 4,940,505 | 7/1990 | Schachameyer et al. . | |
| 5,011,789 | 4/1991 | Burns | 148/DIG. 17 |

FOREIGN PATENT DOCUMENTS

| | | |
|---|---|---|
| 0259777 | 3/1988 | European Pat. Off. . |
| 0322921 | 7/1989 | European Pat. Off. . |
| 0413982 | 2/1991 | European Pat. Off. . |
| 61-034928 | 2/1986 | Japan . |
| 62-271475 | 11/1987 | Japan . |
| 0166220 | 7/1988 | Japan . |
| 1384206 | 2/1975 | United Kingdom . |
| 8201380 | 10/1981 | WIPO . |

OTHER PUBLICATIONS

"Ultrashallow, High Doping of Boron Using Molecular Layer Doping"; by Nishizawa; Applied Physics Letters; 56(1990) Apr. 2, No. 14.

"Metal–Oxide–Silicon Field–Effect Transistor Made by Means of Solid–Phase Doping", by Gong et al.; J. Appl. Phys. 65 (11), Jun. 1, 1989.

Nishizawam, Jun–ichi, "Sample–Structured PMOSFET Fabricated Using Molecular Layer Doping", 8179 IEEE Electron Device Letters, Mar. 11, 1990, pp. 105–106.

Leung, D.L., et al., "CMOS Devices Fabricated in Thin Epitaxal Silicon On Oxide", 1989 IEEE SOS/SOI Technology Conference, Oct., 1989, pp. 74–75.

"Thin–Base Bipolar Technology by Low–Temperature Photo–Epitaxy", *Symposium on VLSI Technology May 1987*, T. Sugii, et al., pp. 35–36.

(List continued on next page.)

*Primary Examiner*—Tuan H. Nguyen
*Attorney, Agent, or Firm*—Loeb & Loeb LLP

[57]            ABSTRACT

A method of producing a bipolar transistor composed of collector, base and emitter regions disposed sequentially on a semiconductor substrate. According to the method, a semiconductor layer is deposited on the collector region, the semiconductor layer is cleaned to expose an active surface, an impurity source gas is applied to the exposed active surface while heating the substrate to form an impurity adsorption layer, the impurity is diffused into the semiconductor layer to form the base region, another semiconductor layer is deposited on the base region, this semiconductor layer is cleaned to expose an active surface, another impurity source gas is applied to the exposed active surface while heating the substrate to form another impurity adsorption layer, and impurity is diffused into the semiconductor layer to from the impurity adsorption layer to form the emitter region.

6 Claims, 5 Drawing Sheets

OTHER PUBLICATIONS

"The Effect of Collisional Broadening on Monte Carlo Simulations of High–Field Transport in Semiconductor Devices", *IEEE Electron Device Letters,* F. Capasso, et al, vol. EDL–2, Nov. 1981.

"Doping Reaction of $PH_3$ and $B_2H_6$ with Si(100)", *J.Appl.Phys.,* Ming L. Yu et al., vol. 59, No. 12, Jun. 16, 1986.

"UV Epitaxy Applied to Make Transistor", *Nikkei High Tech Report,* Takashi Ito, vol. 4, No. 7, Feb. 13, 1989, p. 10.

"An Uncompensated Silicon Bipolar Junction Transistor Fabricated Using Molecular Beam Epitaxy", *EIII Electron Device Letters,* R.G. Swartz, et al., vol. EDL–2, No. 11, Nov. 1981, p. 293.

Nikkei High Tech Report, vol. 14, No. 7, Feb. 13, 1989.

METHOD OF PRODUCING A BIPOLAR TRANSISTOR

This is a continuation of application Ser. No. 07/620,624 filed on Dec. 3, 1990, now abandoned.

BACKGROUND OF THE INVENTION

The present invention relates to a method for producing bipolar transistors, and more specifically relates to transistors in which the base region and emitter region are produced by diffusion.

There is conventionally a known method of producing a bipolar transistor in which a collector region, base region and emitter region are successively superposed on a semiconductor substrate. In this method, the base region is formed by depositing a semiconductor film layer on the preceding collector region to a predetermined thickness, and then by introducing an impurity into the semiconductor film layer at a predetermined concentration. The introduction of the impurity can be effected by ion implantation or conventional diffusion technology.

With recent developments in integrated circuit technology, the size of bipolar transistor has been significantly reduced. In addition, the thickness of the base region has been made smaller and smaller in order to increase operating speed of the bipolar transistor. When introducing an impurity into a thin semiconductor film layer to form such thin base region by ion implantation, there is the drawback that a steep impurity density distribution cannot be easily obtained since the impurity has a Gaussion distribution in the depth direction. On the other hand, when the conventional diffusion technology is utilized to carry out the introduction of impurity, there is caused the drawback that a base region having desired characteristics cannot be obtained since the introduction amount is not controlled accurately.

In the above noted conventional method of producing a bipolar transistor, the emitter region is formed by depositing a semiconductor film layer on the underlying base region and then by introducing an impurity into the semiconductor film layer. Otherwise, the emitter region is formed by introducing one conductivity type of impurity into a semiconductor film layer disposed on the collector region after introducing an impurity of opposite conductivity type into the same semiconductor film layer to form the base region. The introduction of impurity is conventionally effected by ion implantation into the semiconductor film layer.

The ion implantation is carried out by firstly ionizing impurity atoms, then mass-filtering the ions, and thereafter accelerating the ions to a given energy to implant the ions into the semiconductor substrate. Ion implantation allows the impurity introduction amount to be controlled accurately, and allows an impurity to be easily doped through an insulating film into the semiconductor substrate. For this reason, ion implantation is commonly utilized for conventional impurity doping in bipolar transistor fabrication processes.

However, when using ion implantation for forming the emitter region, there is caused the drawback that such ion implantation will adversely affect the base region which is disposed under the semiconductor film layer to be ion-implanted, since the impurity ions are accelerated and irradiated onto the semiconductor film layer. Namely, impact due to the accelerated impurity ions would cause the so-called emitter push effect to deform the diffusion distribution of an impurity in the base region, to thereby degradate performance of the bipolar transistor.

SUMMARY OF THE INVENTION

In view of the above noted drawbacks of the prior art, a first object of the invention is to provide a new doping method effective to introduce an impurity into a thin semiconductor film layer accurately and controllably to form a base region of the bipolar transistor. The second object of the invention is to provide a new doping method effective to introduce an impurity into an emitter region of the bipolar transistor without affecting the impurity diffusion distribution of a precedingly formed base region.

In order to achieve the above noted first object, according to the first aspect of the invention, a bipolar transistor is produced by the sequential steps of depositing a semiconductor film layer on a preceding formed collector region, cleaning the semiconductor film layer to expose an active surface, applying a gas containing an impurity component to the active surface while heating the substrate to form an impurity adsorption layer, and diffusing the impurity into the semiconductor film layer to form a base region.

Preferably, the applying step is carried out by applying a diborane gas containing a boron impurity to a silicon semiconductor film layer. After carrying out this adsorption step, the diffusion step is effected such that the semiconductor film layer is doped with P type impurity of boron so that the doped semiconductor film layer is used as a base region of the NPN bipolar transistor.

In the above described first aspect of the invention, the impurity gas is applied to the active surface of the semiconductor film layer to form an impurity adsorption layer. The amount of adsorbed impurity can be suitably controlled by adjusting the pressure of impurity gas and the application time interval thereof. Solid-phase diffusion of the impurity is effected from a diffusion source in the form of the impurity adsorption layer into the semiconductor film layer to form the base region. The impurity concentration and diffusion depth of the base region are controlled quite accurately by suitably setting the amount of the adsorbed impurity and the diffusion condition such as substrate temperature and heating time.

In order to achieve the above noted second object of the invention, according to the second aspect of the invention, the bipolar transistor is produced by sequential steps of depositing a semiconductor film layer on a previously formed base region, cleaning a surface of the semiconductor film layer to expose an active surface, applying a gas containing an impurity component to the active surface while heating the substrate to form an impurity adsorption layer, and diffusing the impurity into the semiconductor film layer to form an emitter region.

Preferably, the applying step is carried out by applying a diborane gas containing a boron impurity component to a silicon semiconductor film layer to form a boron adsorption layer. Consequently, there is formed an emitter region into which is diffused the P type impurity of boron to produce the PNP bipolar transistor.

In the second aspect of the invention, the impurity gas is applied to the semiconductor film layer deposited on the base region while heating the substrate so as to form the impurity adsorption layer on the active surface. Then, the solid-phase diffusion is effected from a diffusion source composed of the impurity adsorption layer into the semiconductor film layer to thereby from an emitter region. This impurity diffusion is confined within the semiconductor film layer which constitutes the emitter region, hence the impurity density distribution is not affected in the base region disposed under the emitter region.

DESCRIPTION OF THE PREFERRED EMBODIMENTS

Hereinafter, descriptions are given in detail for preferred embodiments of the inventive method of producing bipolar transistors, with reference to the drawings. FIGS. 1A–1F depict the fabrication of an NPN bipolar transistor.

Figure 1A:
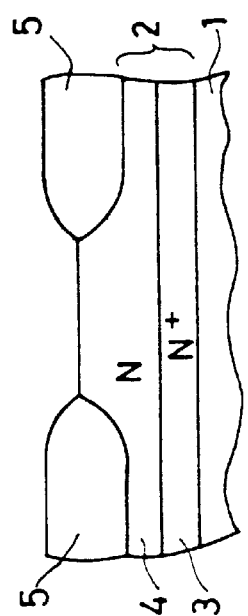
FIGS. 1A–1F are side elevational views illustrating successive steps in a process according to a first embodiment of the invention for fabricating an NPN bipolar transistor.

In the FIG. 1A step, a collector region 2 is formed on a semiconductor substrate 1 composed of silicon. The collector region 2 has a double layer structure composed of a first layer 3 of $N^+$ type and a second layer 4 of N type. The $N^+$ type first layer 3 contains a high density of N type diffused impurity in order to reduce collector-series resistance of the bipolar transistor. Further, the N type second layer 4 is used to form a PN junction. A field oxide film 5 is formed on the collector region 2 so as to isolate individual bipolar transistors from each other. The field oxide film 5 can be formed, for example, by selective thermal oxidation. The field oxide film 5 is provided to surround a device region in which one bipolar transistor is fabricated.

Figure 1B:
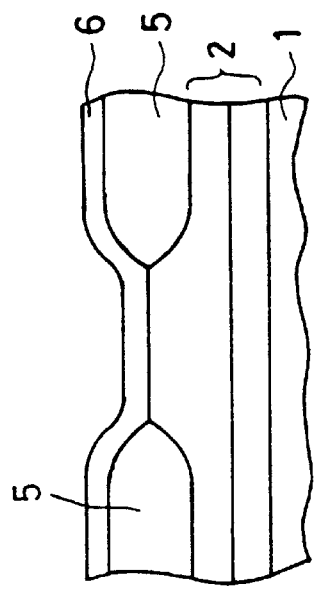

In the FIG. 1B step, the collector region 2 is cleaned over its surface, and thereafter a semiconductor film layer 6 composed of silicon is deposited on region 2 as well as on film 5. The silicon semiconductor film layer 6 has an extremely small thickness since a base region is to be formed therein in later steps. For this, the deposition of the semiconductor film layer 6 can be carried out by, for example, molecular layer epitaxy. By this method, a semiconductor film layer 6 of silicon single crystal can be formed on the collector region 2.

Figure 1C:
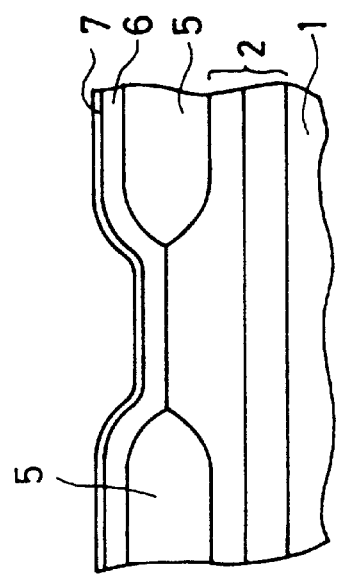

In the FIG. 1C step, the surface of semiconductor film layer 6 is cleaned to expose an active surface. Then, the substrate 1 is contacted with a gas such as diborane which contains an impurity component of boron to form an impurity adsorption layer 7 composed of elemental boron or boron compound. The amount of the adsorbed impurity can be appropriately set by controlling the gas pressure of the diborane, the application time interval and substrate temperature.

Figure 1D:
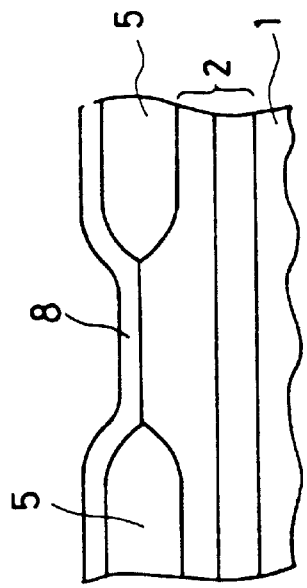

In the FIG. 1D step, the adsorbed impurity is diffused into the semiconductor film layer 6. The diffusion is carried out by heating the substrate. The substrate temperature and heating time interval are suitably set so as to substantially uniformly distribute the boron impurity to form a base region 8.

Figure 1E:
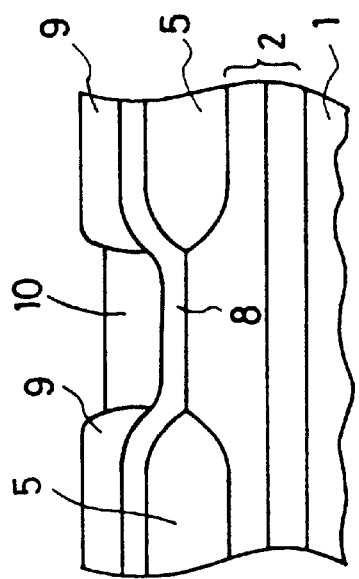

In the FIG. 1E step, an oxide layer 9 is disposed over the substrate surface except each device region. The oxide layer 9 is formed by chemical vapor deposition of silicon dioxide and etching thereof. Subsequently, a silicon semiconductor film layer 10 is deposited in a window surrounded by the oxide layer 9. This silicon semiconductor film layer 10 is formed by epitaxial growth or chemical vapor deposition.

Figure 1F:
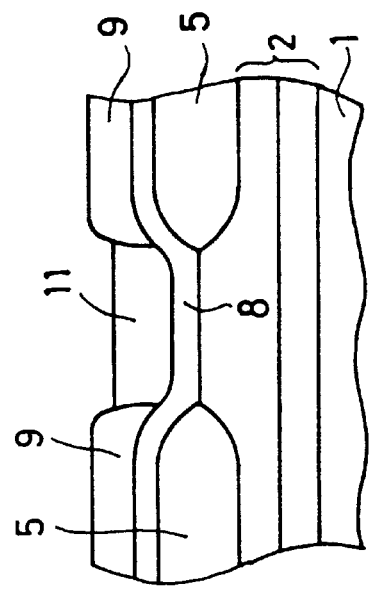

Lastly in the FIG. 1F step, an N type impurity, such as arsenic, is introduced into the silicon semiconductor film layer 10 to form an emitter region 11. Introduction of the N type impurity is effected, for example, by ion implantation. Otherwise, in a manner similar to the doping of the base region with the P type impurity, a source gas containing an N type impurity component may be applied to an active surface of the semiconductor film layer 10 to form an N type impurity adsorption layer, and thereafter diffusion treatment can be conducted to form an emitter region.

Figure 2:
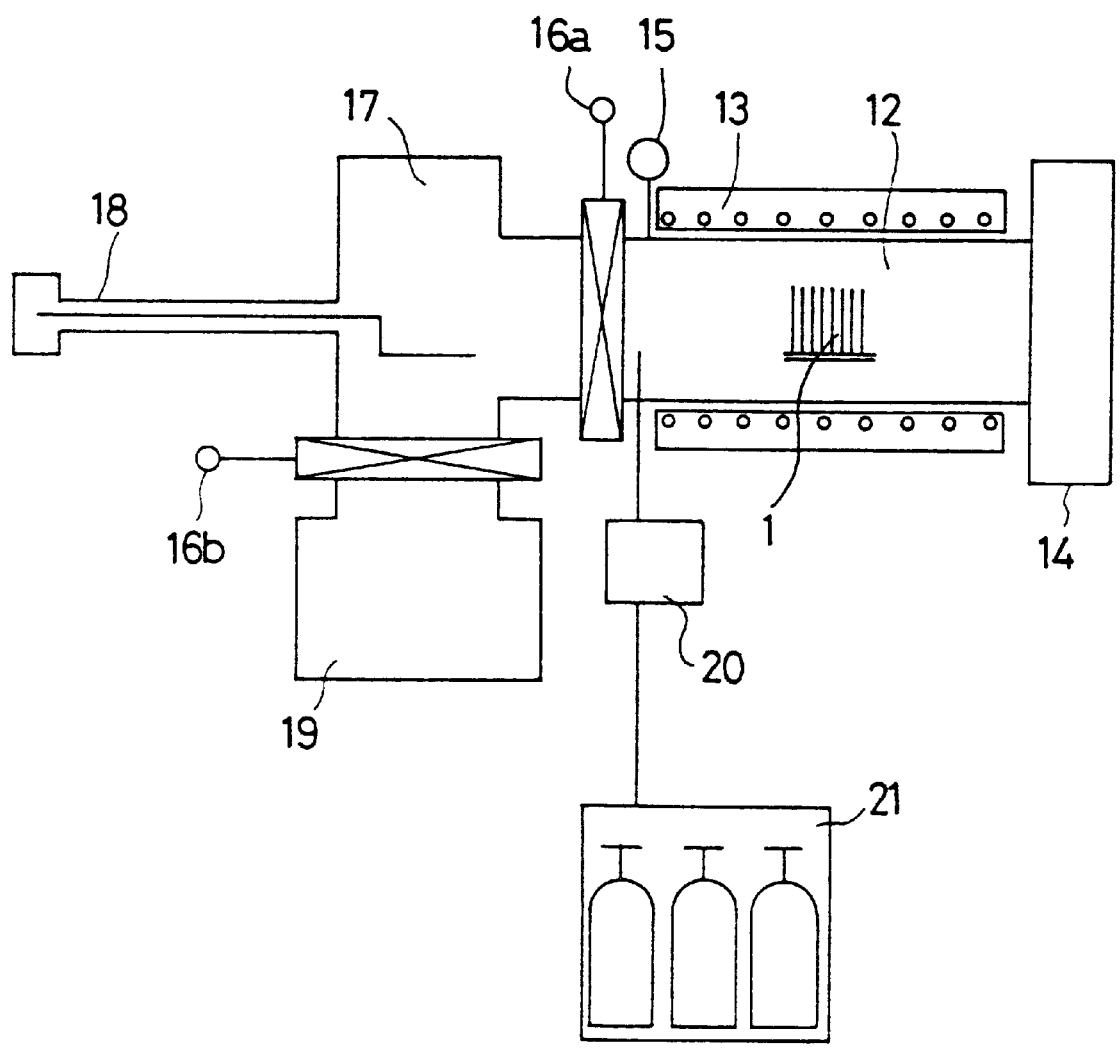
FIG. 2 is a simplified pictorial view of a production apparatus for carrying out bipolar transistor fabrication acording to the invention.

FIG. 2 shows a production apparatus operable to carry out continuously the sequential steps of deposition, cleaning, adsorption and diffusion according to the invention. As shown in the Figure, the apparatus is composed of a main chamber 12 made of quartz, in which is disposed a silicon semiconductor substrate 1 formed with the collector region 2 and the field oxide film 5. The temperature of the substrate 1 is held at a predetermined level by controlling a heating system 13 using an infrared lamp heating or resistance heating. The chamber 12 can be evacuated to a high vacuum by means of a high power vacuum system 14 composed of a plurality of pumps including a main pump in the form of a turbo molecular pump. The vacuum level in chamber 12 is continuously monitored by a vacuum gage 15. The silicon substrate 1 is transported by means of a transportation mechanism 18 to the main chamber 12 from a loading chamber 17 through a gate valve 16a which is held open during transportation. The loading chamber 17 is normally evacuated to a high vacuum level by a vacuum system 19 through a gate valve 16b which is held open except during loading of silicon semiconductor substrate 1 into loading chamber 17 and during transportation of substrate 1 into and out of chamber 12.

A gas supply source 21 is connected to the main chamber 12 through a gas flow control system 20. The gas supply source 21 has a plurality of bottles for storing various gas materials such as hydrogen, diborane and dichlorosilane needed for the sequential treatments. The gas flow control system 20 is operated to control gas species, pressure and application time interval during the course of gas charging from the gas supply source 21 to the chamber 12.

Figure 3:
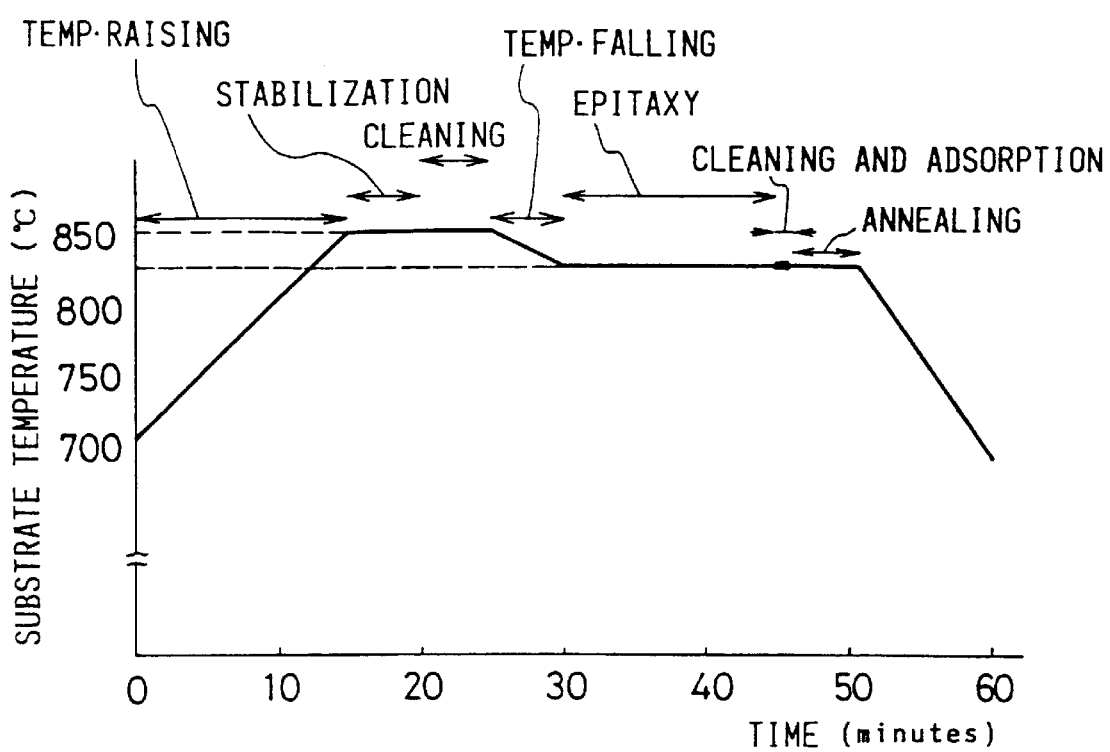
FIG. 3 is a process sequence chart illustrating the bipolar transistor fabrication depicted in FIG. 1.

FIG. 3 is an actual process sequence chart of the above described sequential treatments. The horizontal axis represents time, and the vertical axis represents substrate temperature. Initially, the substrate temperature is raised and stabilized. Thereafter, the surface of a previously formed collector region is cleaned if desired. Then, the substrate temperature is lowered slightly and a semiconductor film layer is deposited on the collector region by epitaxial growth. Next, a cleaning treatment is effected on a surface of the deposited semiconductor film layer to expose an active surface. Thereafter, an impurity adsorption layer is formed by the method according to the present invention. Lastly, annealing is carried out to diffuse the impurity in the impurity adsorption layer into the semiconductor film layer to form a base region. After formation of the base region, the silicon substrate is cooled to room temperature and is taken out from the vacuum chamber 12 to undergo further processing. In the above described fabrication steps, when the epitaxial growth and impurity adsorption are carried continuously, one after the other, the cleaning treatment may be eliminated before introduction of impurity gas because the surface of the epitaxial growth layer is held active and is not covered by a natural oxide film when in a high vacuum environment.

Next, a detailed description will be given of the significant steps of deposition, cleaning, adsorption and diffusion according to the invention, with reference to FIGS. 2 and 3.

Firstly, the deposition step is carried out such that the substrate temperature is raised to 850° C. and a surface of the collector region is cleaned, if needed. Then the substrate temperature is lowered to 825° C., and thereafter a silicon semiconductor film layer is deposited by epitaxial growth. The epitaxial growth is conducted in that a source gas such as dichlorosilane ($SiH_2Cl_2$) or silane ($SiH_4$) is introduced into the main chamber 12 to effect so-called molecular layer epitaxy. This technology is effective to control the thickness of the semiconductor deposition layer by molecular layer order so as to accurately set a desired film thickness. This molecular epitaxy technology is disclosed, for example, in Japanese Patent Application Laid-open No. 153978/1984. The silicon single crystal film may be deposited by molecular beam epitaxy or chemical vapor deposition instead of molecular layer epitaxy.

Next, the cleaning treatment is performed on the deposited semiconductor film layer surface. This cleaning is carried out such that background pressure is set below $1\times10^{-4}$ Pa in the main chamber and the substrate temperature is held at, for example, 825° C., and then hydrogen gas is introduced into the chamber. The hydrogen gas is delivered for a predetermined time interval so as to raise the chamber pressure to, for example, $1.3\times10^{-2}$ Pa. The cleaning treatment does not necessarily require the introduction of hydrogen gas, but the silicon substrate 1 may be simply placed in the highly evacuated chamber while heating so as to effect the cleaning. Otherwise, when carrying out formation of an impurity adsorption layer in the same chamber immediately after the epitaxial growth of the semiconductor film layer, the cleaning treatment may be eliminated because the surface of the semiconductor film layer is maintained chemically active.

Next, an adsorption layer containing elemental boron or a boron compound is formed on the active surface of the silicon semiconductor film layer. For example, while the substrate temperature is maintained at 825° C., diborane gas ($B_2H_6$) containing boron is applied to the surface of the silicon substrate 1. The diborane gas dilluted with nitrogen carrier gas to a concentration of 5% is introduced into the chamber for a predetermined time interval so as to fill the chamber at a pressure of $1.3\times10^{-2}$ Pa to thereby form the boron-containing adsorption layer.

Lastly, the diffusion treatment is carried out such that the delivery of diborane gas is stopped after formation of the impurity adsorption layer, and the substrate is annealed under vacuum to effect solid-phase diffusion of the boron from a diffusion source in the form of the adsorption layer. Concurrently, the diffused impurity atoms are activated in the silicon film layer.

Figure 4:
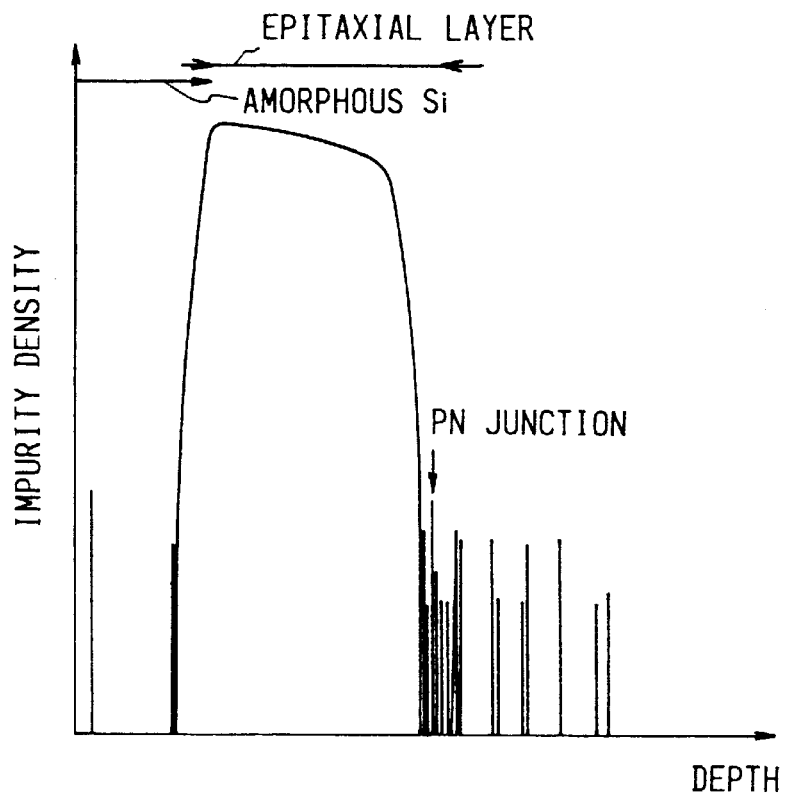
FIG. 4 is a diagram showing the impurity density profile in a base region of the bipolar transistor formed by the method depicted in FIG. 1.

FIG. 4 shows an impurity diffusion density profile in the base region obtained by the process according to thew invention. This profile is obtained by a secondary ion mass-spectrometer. A surface of the sample substrate is coated by an amorphous silicon layer in order to improve analysis accuracy on the sample surface. Therefore, in the FIG. 4 profile, the original surface level of the semiconductor film layer diffused with the impurity is indicated at a boundary between the amorphous silicon layer and the semiconductor film layer. The semiconductor film layer, i.e. the epitaxial layer, is doped with the impurity boron in a manner which is highly uniform with respect to depth, as shown in the profile. The impurity density profile drops steeply at the PN junction region between the lower collector region and the upper base region.

As described above, according to the first aspect of the invention, the impurity diffusion is accurately controllably effected to the extremely thin epitaxial layer while regulating the impurity distribution profile in the depth direction.

Figure 5:
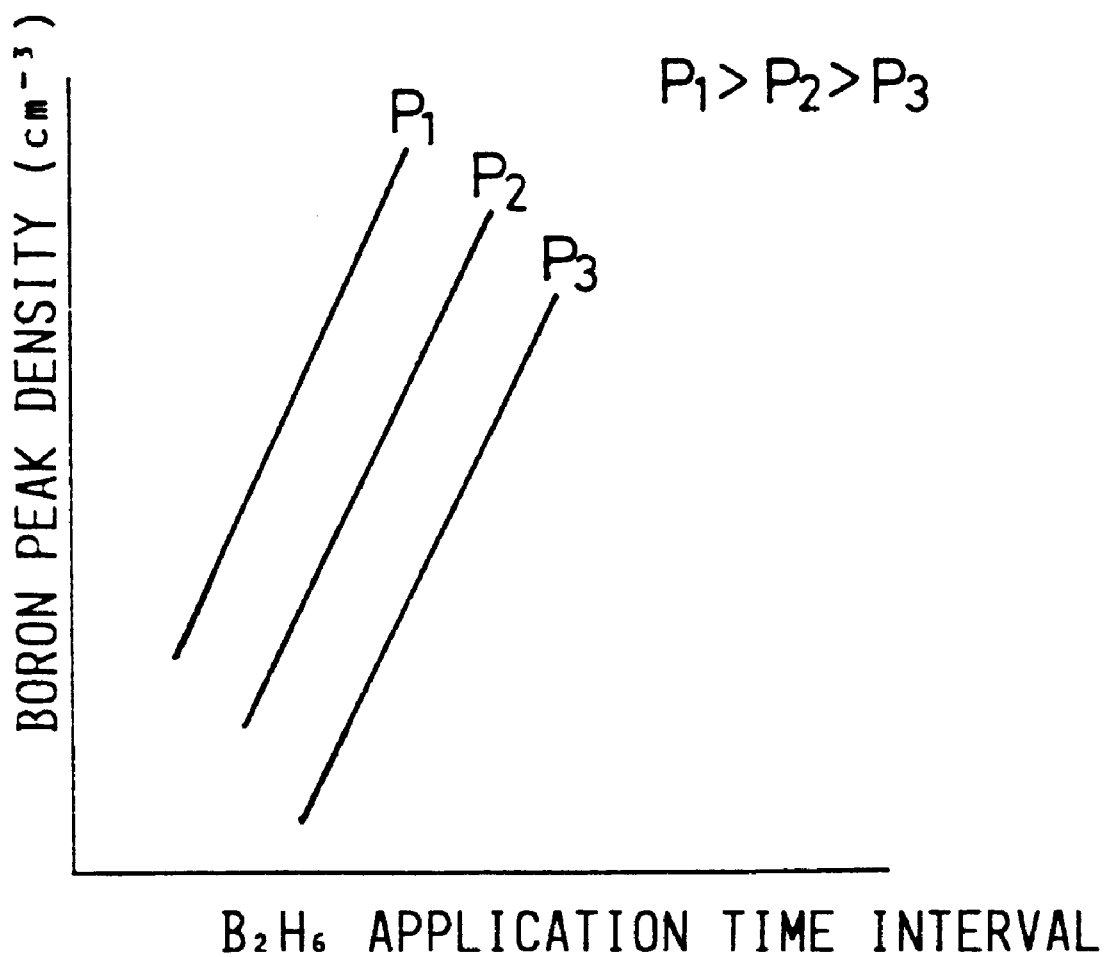
FIG. 5 is a graph showing the relation between boron peak density and impurity gas application conditions.

FIG. 5 is a graph showing the relation between the boron peak density in the base region, and the application pressure ($P_1$, $P_2$, $P_3$) and application time interval of diborane gas. As shown in the graph, the higher the application pressure of diborane gas, the higher the boron peak density. The longer the application time interval, also the higher the boron peak density. In this manner, by suitably setting the application conditions of diborane gas, the boron impurity concentration can be controlled in the base region.

In the above described embodiment, the P type impurity of boron is diffused into the silicon semiconductor film layer so as to form a P type base region of an NPN bipolar transistor. The doping of P type impurity can be effected using various source gases of a Group III element compound such as trimethyl gallium (TMG) or boron trichloride ($BCl_3$) besides the above described diborane gas. On the other hand, in order to dope an N type impurity into a silicon semiconductor film layer to form an N type base region of a PNP bipolar transistor, there may be utilized various impurity gases such as arsine ($AsH_3$), phosphorus trichloride ($PCl_3$), antimony pentachloride ($SbCl_5$) and phosphine ($PH_3$).

The substrate temperature is set to 825° C. in the embodiment. According to the inventors' studies, the substrate temperature should be set in the range from 800° C. to 1200° C. optimumly in conjunction with the background pressure and ambient gas species for the surface cleaning treatment. The substrate temperature should be preferably set in the range from 400° C. to 950° C. for the formation of impurity adsorption film. Further, the substrate temperature should be preferably set in the range from 800° C. to 1100° C. for the epitaxial growth of the semiconductor film layer.

As described above, according to the first aspect of the invention, an impurity adsorption layer is directly formed on a semiconductor film layer deposited on a collector region, and solid-phase diffusion is effected from a diffusion source in the form of the adsorption layer so as to intensively and dope the impurity into the semiconductor film layer to a limited and controllable depth to thereby form therein a base region. Consequently, the thickness of the base region can be considerably reduced as compared to the prior art, thereby advantageously increasing the operating speed of bipolar transistor.

The following description relates to the second embodiment of producing a PNP bipolar transistor in accordance with FIGS. 6A–6F.

Figure 6A:
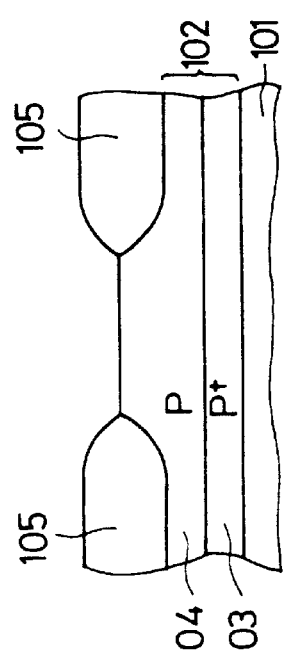
FIGS. 6A–6F are views similar to those of FIGS. 1 relating to fabrication of a PNP bipolar transistor.

In the first step of FIG. 6A, a collector region 102 is formed on a semiconductor substrate 101 composed of silicon. The collector region 102 has a double layer structure composed of a first diffusion layer 103 doped with high density of P type impurity and a second diffusion layer 104 doped with moderate density of the same P type impurity. The high density impurity first diffusion layer 103 is provided to reduce collector-series resistance of the bipolar transistor, and the upper second diffusion layer 104 of P type is provided to form a PN junction. A field oxide film 105 is formed on the collector region 102. This field oxide film 105 is provided to isolate a plurality of bipolar transistors integrated on the semiconductor substrate 101 from each other. The field oxide film 105 surrounds each device region. The field oxide film 105 is formed by, for example, selective thermal oxidation.

Figure 6B:
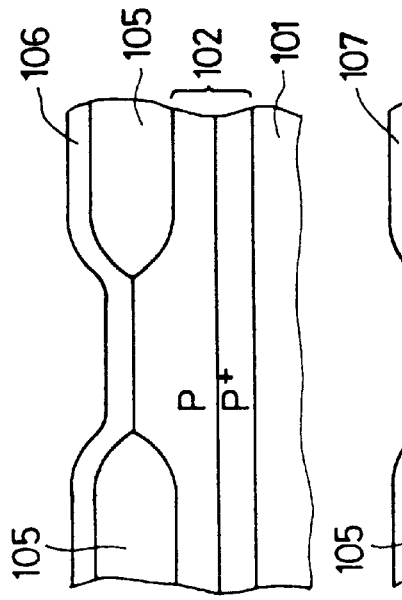

In the FIG. 6B step, the collector region 102 is covered by a first semiconductor film layer 106 composed of silicon. This first semiconductor film layer 106 is deposited by, for example, epitaxial growth or chemical vapor deposition of silicon.

Figure 6C:
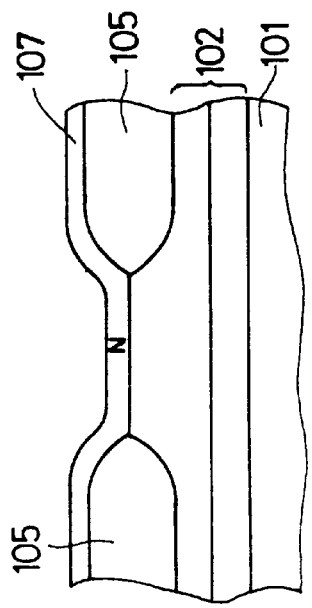

Subsequently in the FIG. 6C step, an impurity of N type is introduced into the first semiconductor film layer 106 to form a base region 107. The introduction of N type impurity is, for example, carried out by ion implantation to effect doping with arsenic as the impurity.

Figure 6D:
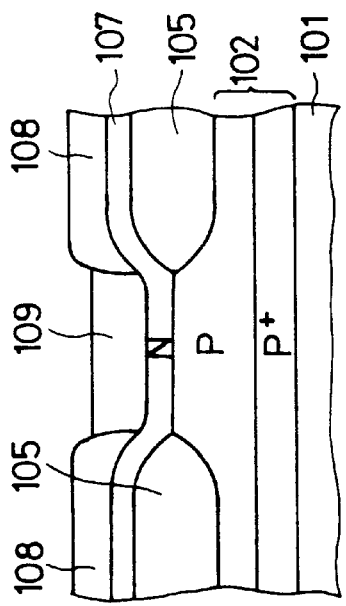

In the FIG. 6D step, an oxide film 108 is formed on the base region 107. The oxide film 108 is arranged to surround each device region at a position corresponding to the field oxide film 105. Further, a second semiconductor film layer 109 is deposited on the device region surrounded by the oxide film 108. The second semiconductor film layer 109 is formed by epitaxial growth or chemical vapor deposition of silicon in a manner similar to the first semiconductor film layer 106. The second semiconductor film layer 109 has a film thickness greater than that of the first semiconductor film layer (106) in which is formed the base region 107.

Figure 6E:
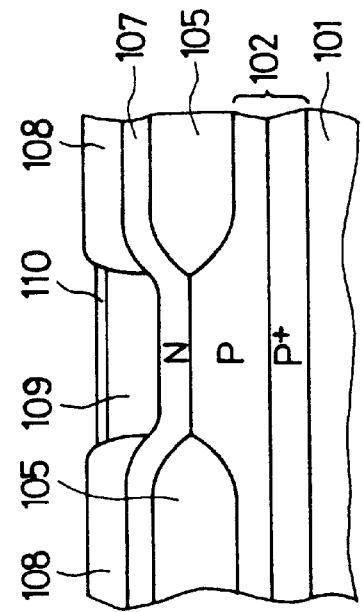

In the FIG. 6E step, the surface of the second semiconductor film layer 109 is cleaned to expose an active silicon surface. Next, while heating the substrate 101, the active surface is contacted with an impurity gas of diborane having a P type impurity component of boron to form an impurity adsorption layer 110. The amount of the adsorbed impurity in impurity adsorption layer 110 is suitably set by controlling the pressure and application time interval of the diborane impurity gas. This impurity adsorption layer 110 is firmly and stably deposited on the active surface of the second semiconductor film layer 109. If an active surface is reserved after completion of the deposition of the second semiconductor film layer 109 and the formation of impurity adsorption film 110 is effected immediately, the associated cleaning treatment may be eliminated.

Figure 6F:
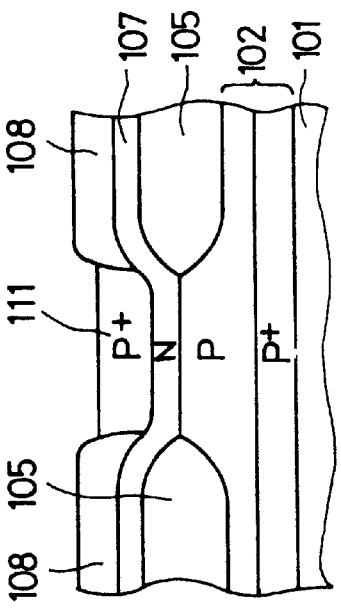

Lastly, in the FIG. 6F step solid-phase diffusion is carried out from a diffusion source composed of the deposited impurity adsorption layer 110 into the second semiconductor film layer 109 to form an emitter region 111. The diffusion of this P type impurity is limited within the emitter region 111 and is effected by having a doping amount which is more than a predetermined value. For this, the amount of impurity in the adsorption layer 110 must be optimumly set. The setting of the adsorption amount is controlled by adjusting the delivery pressure and application time interval of the impurity gas as described above.

The base region is doped with the impurity by ion implantation in the above described embodiment; however, an impurity gas containing an N type impurity component may be utilized to form an adsorption layer of N type impurity, and solid-phase diffusion may be carried out from a diffusion source composed of this adsorption layer so as to form an N type base region.

As described above, according to the invention, an impurity adsorption layer is deposited on an emitter region, and solid-phase diffusion is carried out from the adsorption layer so as to introduce an impurity. Hence the impurity diffusion distribution in the base region which is formed under the emitter region cannot be adversely affected.

This application relates to subject matter disclosed in Japanese Application Numbers 1-313724, filed Dec. 1, 1989, and 1-313725 filed on Dec. 1, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a method of producing a bipolar transistor formed by sequentially superposing a collector region, a base region and an emitter region on a semiconductor substrate, the improvement comprising the steps of:

forming the collector region;

placing the substrate in a chamber;

cleaning a surface of a semiconductor region to be the base region on the collector region, in the chamber, by a procedure which includes exposing the surface to a background pressure of less than $10^{-4}$ Pa and then performing a heat treatment to expose an active surface;

applying a gas containing an impurity component to the active surface in the chamber while heating the substrate to a temperature between 400° C. and 950° C. so as to form an impurity adsorption layer; and diffusing the impurity component from the adsorption layer into the semiconductor region to form the base region.

2. The method according to claim 1 wherein the bipolar transistor is an NPN transistor, the gas is diborane, and the impurity component is boron.

3. The method according to claim 1 further comprising, after said step of forming and before said step of cleaning, depositing a semiconductor film layer on the collector region in the chamber, and wherein said semiconductor film layer constitutes said semiconductor region.

4. In a method of producing a bipolar transistor formed by superposing sequentially a collector region, a base region, and an emitter region on a semiconductor substrate, the improvement comprising the steps of:

forming the collector region and forming the base region on the collector region;

placing the substrate in a chamber;

cleaning a surface of a semiconductor region to be the emitter region on the base region, in the chamber, by a procedure which includes exposing the surface to a background pressure of less than $10^{-4}$ Pa and then performing a heat treatment to expose an active surface;

applying to the active surface, in the chamber, a gas containing an impurity component while heating the substrate to a temperature between 400° C. and 950° C. to form an impurity adsorption layer; and diffusing the impurity component from the adsorption layer into the semiconductor region to form the emitter region.

5. The method according to claim 4 wherein the bipolar transistor is a PNP transistor, the gas is diborane, and the impurity component is boron.

6. The method according to claim 4 further comprising, after said step of forming and before said step of cleaning, depositing a semiconductor film layer on the base region in the chamber, and wherein said semiconductor film layer constitutes said semiconductor region.

* * * * *